United States Patent
Lin et al.

(10) Patent No.: US 7,667,338 B2
(45) Date of Patent: Feb. 23, 2010

(54) PACKAGE WITH SOLDER-FILLED VIA HOLES IN MOLDING LAYERS

(76) Inventors: Paul T. Lin, 5125 Tennington Park, Dallas, TX (US) 75287; Chi-Shih Chang, 4106 Love Bird La., Austin, TX (US) 78730

( * ) Notice: Subject to any disclaimer, the term of this patent is extended or adjusted under 35 U.S.C. 154(b) by 159 days.

(21) Appl. No.: 11/880,753

(22) Filed: Jul. 23, 2007

(65) Prior Publication Data

US 2008/0036050 A1   Feb. 14, 2008

Related U.S. Application Data

(60) Provisional application No. 60/836,419, filed on Aug. 8, 2006, provisional application No. 60/918,279, filed on Mar. 15, 2007.

(51) Int. Cl.
   *H01L 23/28* (2006.01)
(52) U.S. Cl. .................................. 257/787; 257/686
(58) Field of Classification Search .............. 257/686, 257/787, 778, 777, 659, 707, 706, 666
   See application file for complete search history.

(56) References Cited

U.S. PATENT DOCUMENTS

| | | | | |
|---|---|---|---|---|
| 5,608,265 | A  * | 3/1997 | Kitano et al. | 257/738 |
| 5,973,393 | A  * | 10/1999 | Chia et al. | 257/690 |
| 6,309,916 | B1 * | 10/2001 | Crowley et al. | 438/127 |
| 6,580,167 | B1 * | 6/2003 | Glenn et al. | 257/718 |
| 6,614,104 | B2 * | 9/2003 | Farnworth et al. | 257/686 |

* cited by examiner

*Primary Examiner*—S. V Clark
(74) *Attorney, Agent, or Firm*—Bo-In Lin

(57) ABSTRACT

The present invention discloses an electronic package to contain and protect an integrated circuit (IC) chip. The electronic package further includes a leadframe, a flexible circuit or PCB type of substrate. The leadframe, flexible circuit or PCB type substrate further includes solder contacts, which are aligned with via holes in the molding layers on the top and bottom sides of the package. These via holes are for placing solder paste or solder balls from above and below for electrical access to the IC chip. These solder balls provide access for electrical testing after the package is mounted on a motherboard. They also provide the connection points for stacking multiple packages vertically.

25 Claims, 8 Drawing Sheets

Case #1 Donut Shape Contact

Case #2 Straight Line Contact

Case #3 Taper Line Contact

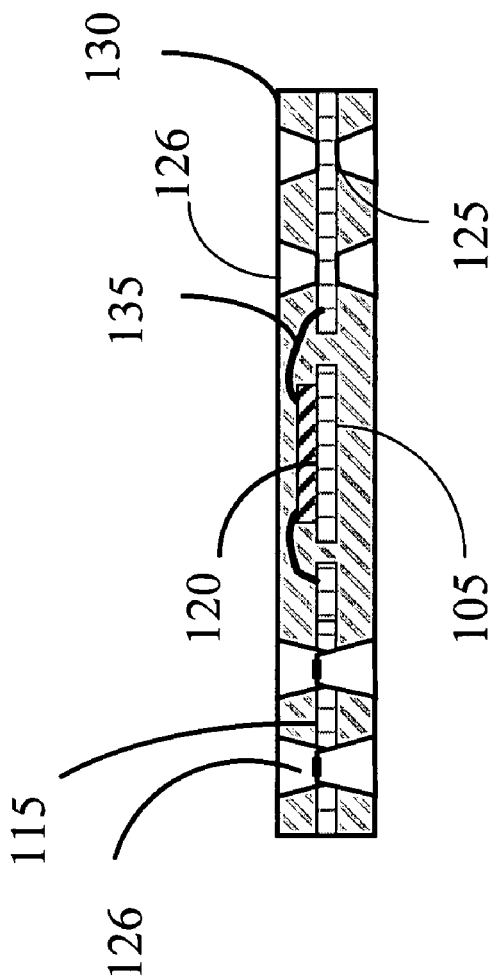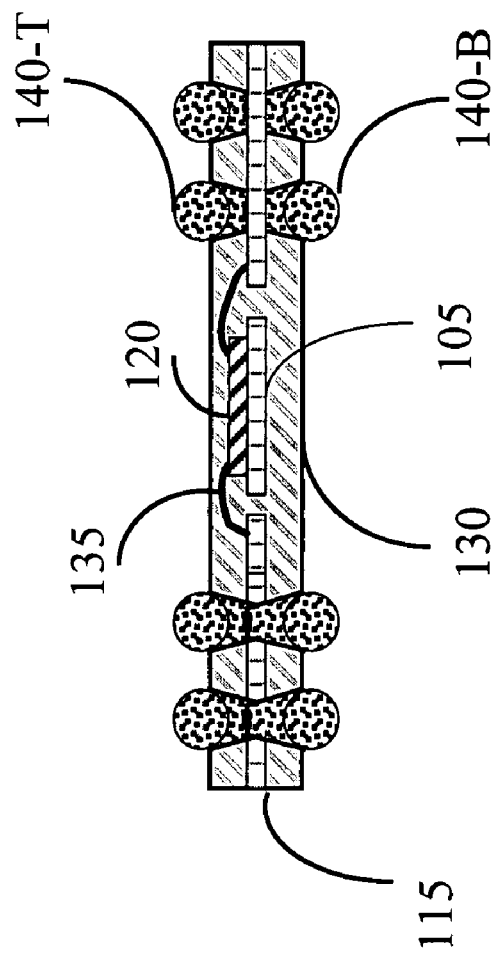
Fig. 5A
Fig. 5B

PACKAGE WITH SOLDER-FILLED VIA HOLES IN MOLDING LAYERS

This patent application is a Non-Provisional Application and claims the Priority dates of a first Provisional Application 60/836,419 on Aug. 8, 2006 and a second Provisional Application 60/918,279 filed on Mar. 15, 2007 filed by the Applicants of this Non-Provisional Patent Application.

BACKGROUND OF THE INVENTION

1. Field of the Invention

This invention relates generally to the electronic package. More particularly, this invention relates to a package configuration to provide low cost high performance electronic device packages that allows on-board testing and options for attaching electrical shielding, heat spreader or stack of multiple packages for highly integrated portable electronic products.

2. Description of the Prior Art

For conventional molded plastic packages using leadframe for interconnection substrates, packages such as QFP, SOIC, PLCC or SOJ, the IC chip and chip interconnects by either wire bonding or implementing a flip chip configuration, the packages are molded into square or rectangular body. All electrical paths are extended to outside of the molded plastic body along the perimeter of the plastic body. Since the outer lead pitch (OLP), typically 1 mm or greater, along the perimeter of the molded plastic body limits the connection density, for electronic devices that have large number of external electrical paths along the perimeters, it is generally required to make the plastic body to have a relatively large size. Presently, for a quad flat package (QFP), a practical limit is two hundred and eight (208), using 1.27 mm OLP. Furthermore, extended pins outside of the plastic body along the perimeters are very vulnerable to damage from handling or testing.

Plastic ball grid array (PBGA) was developed to address the issues caused by the limitation of the pin count for the conventional leadframe packages. In a PBGA package, the IC chip and the interconnecting wires or metal traces are bonded onto a PCB type of substrate. A plastic molding compound is used to encapsulate the IC chip and the interconnections on only one side of the substrate. All electrical signals are connected through via holes opened through the substrate to solder balls on the other side of substrate. Since the solder balls can be arranged in area array format, the number of signal connections can be much higher than that of the QFP packages. Therefore, a PBGA package that has a few hundreds of solder balls is quite common at the present packages. But, for one side molded BGA, the top and bottom structures are not symmetrical. As the bending or warping could occur throughout the hot processing steps or upon the heat cycles that occurs in the operational environment, it creates great stress onto IC chip and caused reliability vulnerability. Furthermore, all solder balls are placed under the substrate. Many of their connecting traces are routed through multi-layers inside of the motherboard, without any top surface pads. Thus, in most cases, individual PBGA cannot be probed or tested after it has been mounted on the motherboard.

For all existing molded packages, the electrical signal paths are either along the perimeters or from the bottom of molded body. For connections of these configurations, connections from the top of the molded body cannot be made for stacking or testing purposes. Therefore, a need still exits in the art to provide new and improved packaging configurations and also manufacturing procedures for resolving the above discussed problem and difficulties.

Additionally, the PBGA packages are still limited by the high cost of the substrate materials. The conventional quad flat pack (QFP) packages are not amiable to stacking to achieve a three-dimensional packaging configuration. Therefore, a need still exits in the art to provide low cost and improved packaging configurations and also manufacturing procedures for resolving the above discussed problems and difficulties.

SUMMARY OF THE PRESENT INVENTION

It is therefore an aspect of the present invention to provide an improved configuration and procedure for packaging an integrated circuit (IC) chip and assembling multiple IC packages together as modules by implementing a via-hole ball-grid-array (VHBGA) configuration. The VHBGA is implemented with a leadframe, flexible circuit or PCB type of substrate provided with via holes in the molding layers from the top and the bottom sides of the molded package. These via holes are filled with solder materials, thus providing top and bottom connections and electrical accesses features to the metal traces in the package substrate. Due to space limitation for some packages with high input-output (I/O) requirements, the via-holes in the molding layers may overlap with the metal traces in order for the solder to make electrical connections. The via holes and metal traces can be of different shapes or sizes but they have to be overlapping or touching each other in order to make solder connections.

Another aspect of the present invention to provide an improved via-hole in molded packaging configuration and method to achieve cost savings by replacing expensive substrate with low cost leadframe by making use of existing QFP equipment and eliminating the lead forming and replacing soldering steps with standard BGA solder ball placement processes.

Another aspect of the present invention to provide an improved via-hole in molded package configuration and method to improve the thermal performance of the packaged products by attaching ground shielding and heat spreader to the IC chip over the top of the VHBGA package or stacked modules.

Another aspect of the present invention to provide molded standoff features that will prevent the collapse of solder balls during mounting or stacking processes.

Another aspect of the present invention to provide an improved via-hole molded package configuration and method to allow more testing flexibilities with top and bottom solder balls for probing and testing after the VHMP packaging processes are completed, or after the VHMP package is mounted on the motherboard.

Another aspect of the present invention to provide an improved via-hole BGA packaging configuration and method to allow stack-mounting packages of different sizes by providing top and bottom solder balls on a VHBGA package thus achieving cost and space savings in manufacturing and assembling miniaturized electronic devices.

Another aspect of the present invention to provide an improved via-hole BGA packaging configuration and method to improve the electrical performance and product reliability with the leads all enclosed and protected in the plastic molding packages. Shortest electrical connections are achieved with direct surface mounting configuration made possible with the top and bottom solder balls on each of the VHBGA packages.

Briefly, in a preferred embodiment, the present invention comprises an electronic package for containing and protecting an integrated circuit chip therein. The electronic package includes a leadframe, or a flexible circuit or PCB type of substrate. The leadframe, flexible circuit or PCB type substrate further includes solder contact pads for placing solder paste or solder balls through via holes in the molding layers from above and below whereby electrical access to the IC chip is available from the top and bottom of the electronic package.

These and other objectives and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 5A shows the cross-sectional view of the molded package of FIG. 4, and FIG. 5B shows the cross-sectional view after solder ball placement and reflow.

DETAILED DESCRIPTION OF THE PREFERRED EMBODIMENT

Figure 1:
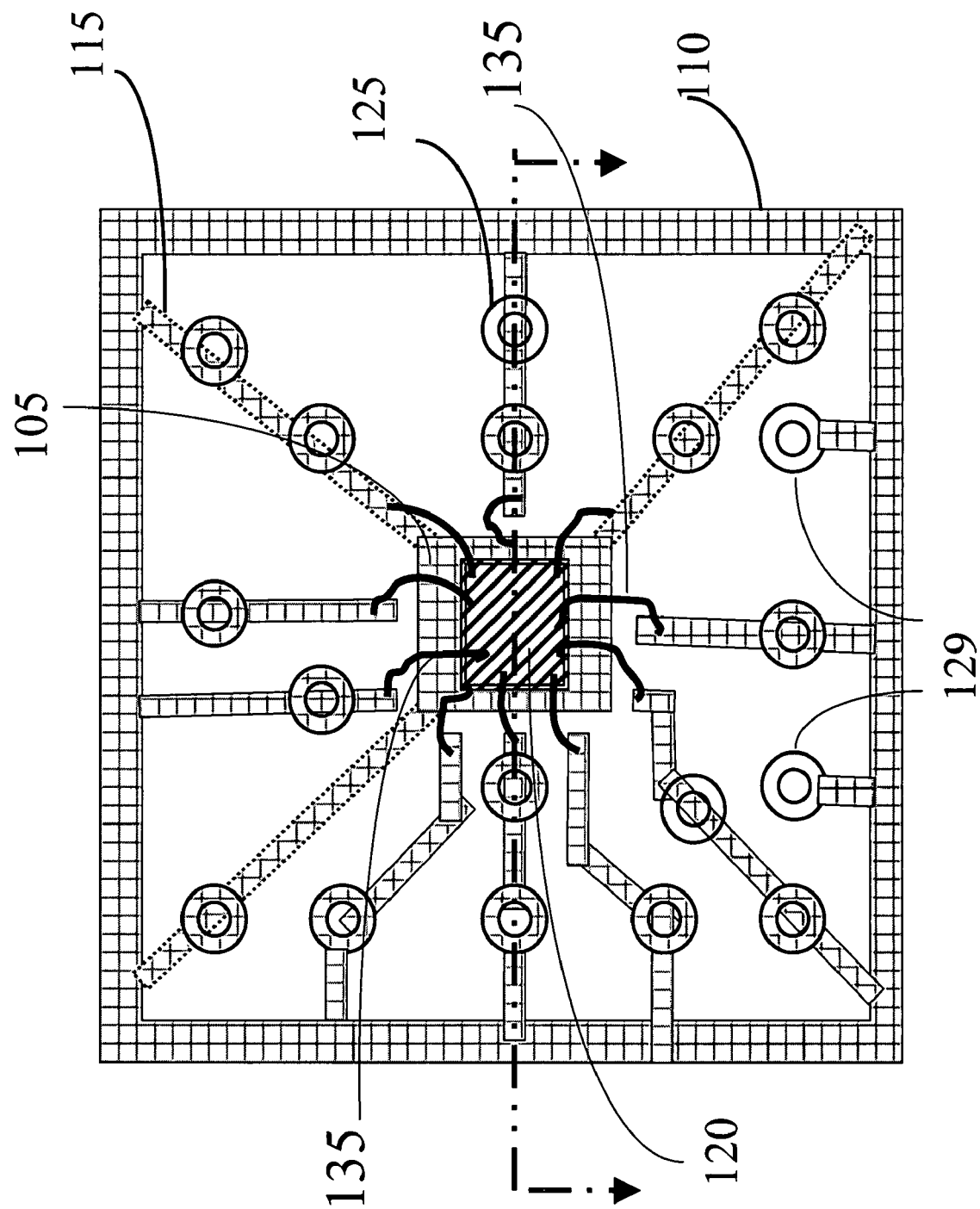
FIG. 1 shows the top view of a leadframe of this invention, including the locations of the intended via holes in the molding layers.
Figure 8:
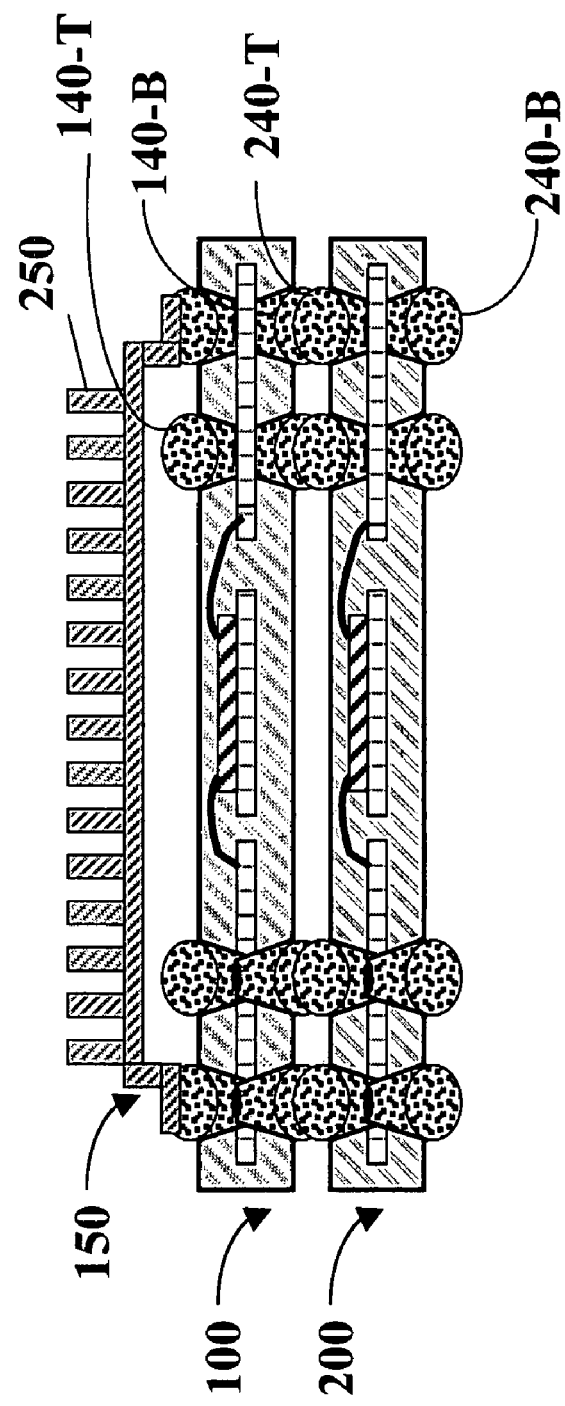
FIG. 8 shows a cross sectional view of two stacked VHBGA package configuration by mounting the bottom solder balls of the top package on top of the top solder balls of the bottom package.
Figure 9A:
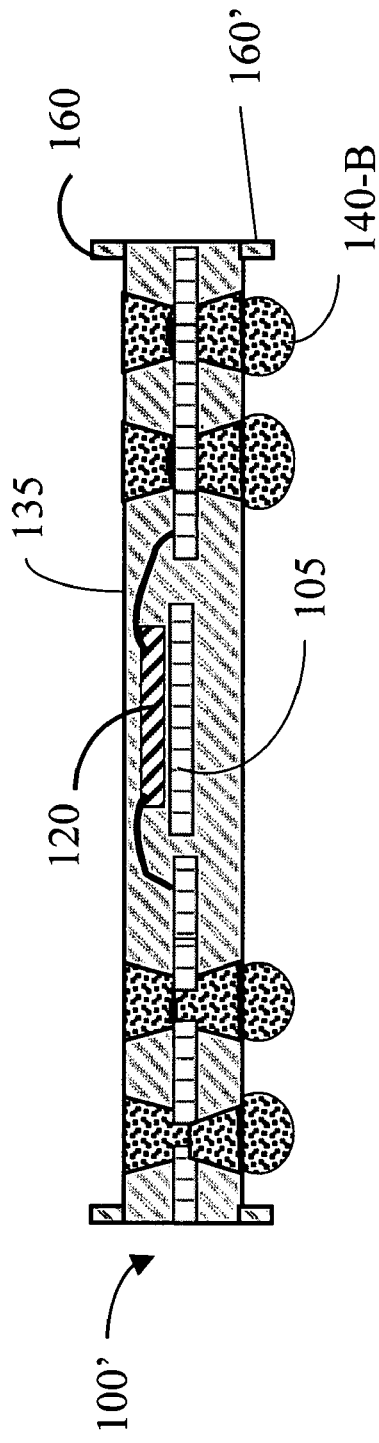
FIG. 9A shows a cross-section view of a VHBGA package with molded standoff supporting structure to maintain the spacing between the package and the motherboard, thus reduce the risk of solder balls collapsing due to surface tensions during high temperature processing.
Figure 9B:
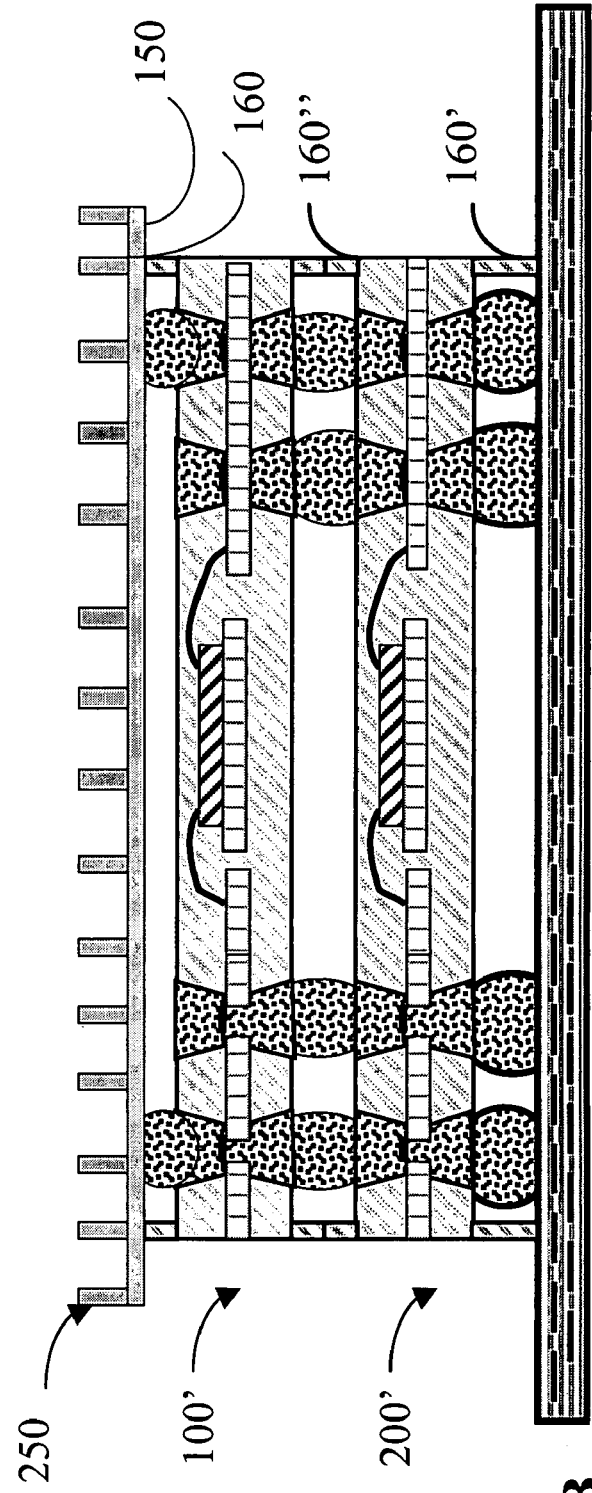
FIG. 9B shows a cross-section view of a two stacked-VHBGA packages and heat spreader with standoff height supporting structure to reduce the risk of solder balls collapsing due to surface tensions during high temperature processing.

FIG. 1 shows a top view of a leadframe after the operation of a die bonding to form a molded ball grid array (BGA) package with via holes in the molding layers on both the top and bottom sides of the package according to an exemplary embodiment of this invention. The leadframe includes a peripheral supporting frame 110 with four peripheral frame stripes configured substantially with a square or rectangular shape. The leadframe further includes a plurality of metal lines 115 extended to the peripheral frame 110 from different predefined locations surrounding a central portion 105, which is designated for placement of an integrated circuit (IC) chip 120. Each of these metal lines 115 further includes at least one or several contact pads 125. By applying a wire bonding process, the bonding wires 135 are formed to interconnect the integrated circuit (IC) chip 120 to the bonding wire fingers, which is at the inner end of the metal line 115, and has proper local plating layer to enhance wire bonding. The contact pad locations are to match the solder-filled via holes in the molding layer shown in FIG. 2 below. Note that some contact locations such as 129 do not have electric connection to the chip 120. Such contact locations 129 are provided to serve as a "pass through" for a signal I/O in a future stacked dice above it as shown in FIG. 8 and FIG. 9B, to pass through the lower molded body and be connected to motherboard directly. It is another aspect of this invention that the solder ball at 129 enhances the mechanical strength of the VHBGA to motherboard attachment. The solder ball at 129 is completely surrounded by the top and bottom molding layers, and shares the shear stress with other metal connections between the VHBGA and the motherboard. Therefore, the solder balls at the contact location 129 will enhance the attachment reliability, an additional benefit of VHBGA package.

Figure 2:
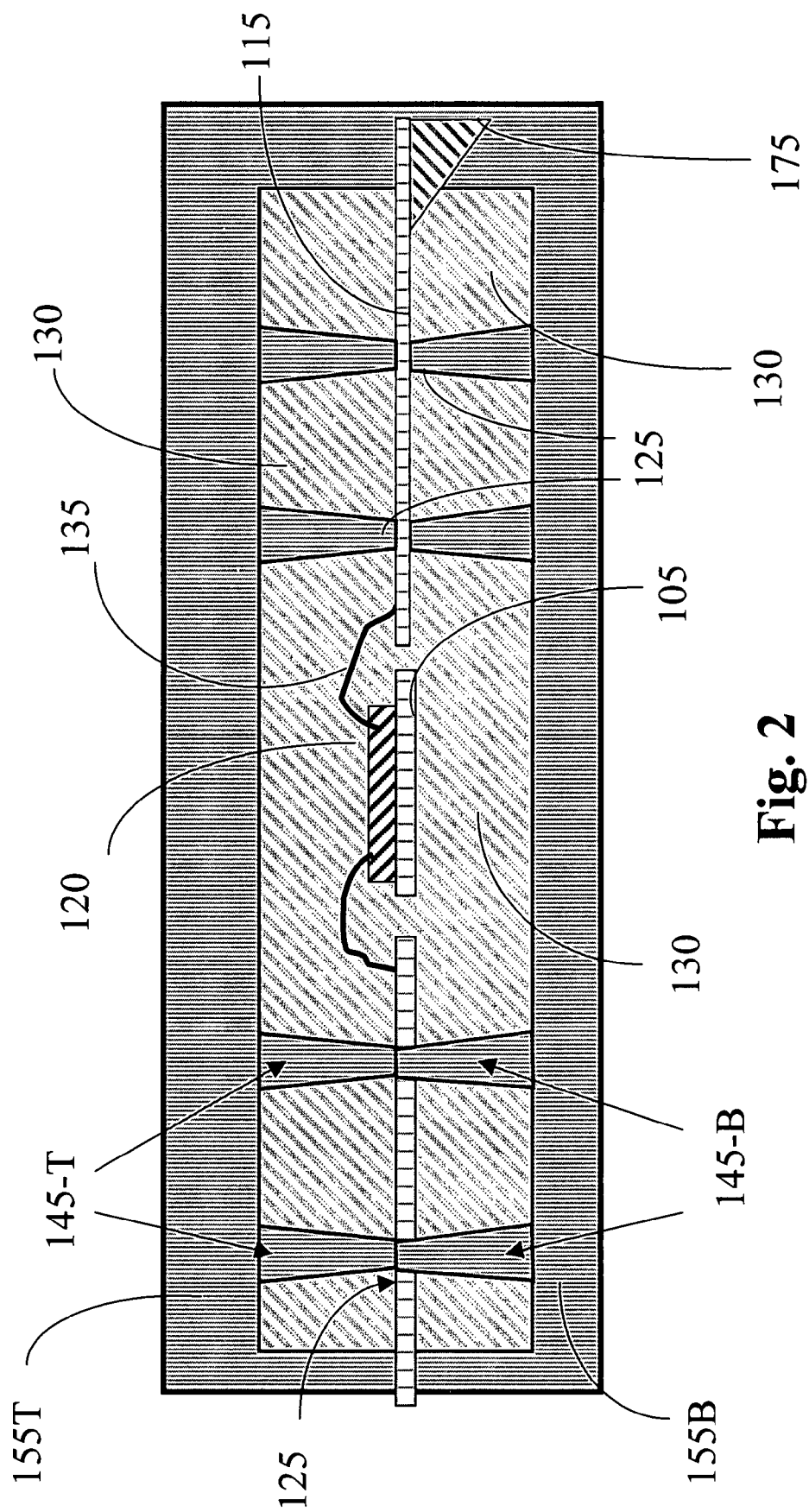
FIG. 2 shows the cross-section of the molding fixture. It has plugs for the intended via holes matching the contact pad locations. On the left-hand side, the contact pad locations have holes in the leadframe. On the right-hand side, the contact pad locations have no holes in the leadframe. In an actual design, the via-hole locations may be placed anywhere as needed.

FIG. 2 shows a cross-sectional view of a molding fixture for forming a molded package having via holes in the molding layers above and below the leadframe shown in FIG. 1. A molding fixture includes a top-mold 155-T and a bottom-mold 155-B. The molding fixture also includes a molding gate 175 for injecting molding compound 130 to fill up the space above and below the leadframe. The molding fixture further includes a plurality of top mold plug 145-T and bottom mold plug 145-B matching the location of the contact pad 125 disposed on the metal lines 115. The mold injection operation fills up the space above and below the leadframe, and extends to four sides with thin mold with bleeding stop at dam bar frame, which is a short distance away from the peripheral supporting frame 110. Afterwards, the top mold 155-T and bottom mold 155-B are opened together with the top and bottom mold plugs 145-T and 145-B, leaving the top and bottom via holes 126 (shown in FIGS. 4B, 4C & 5A). The top and bottom mold plugs 145-T and 145-B are coincident with the locations of the contact pads 125 thus the via-holes 126 are matched with the contact pads 125 as that shown in FIG. 5A below.

Figure 3:
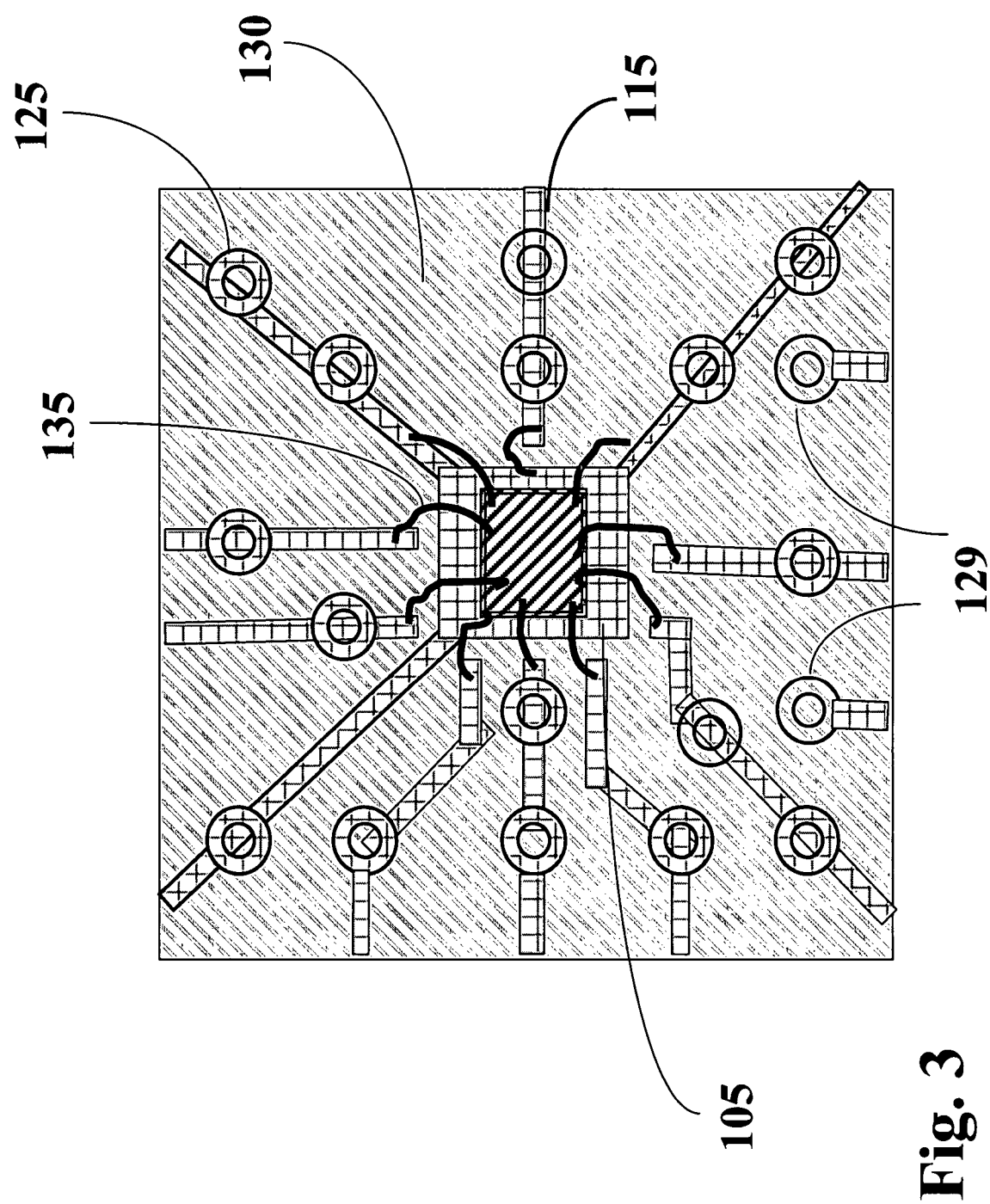
FIG. 3 shows the top view of an as molded package. It has one chip and some bonded wires inside the mold compound, and via holes in the top molding layer and the peripheral supporting frame outside molded body has been trimmed off.

FIG. 3 is a top view for showing the molded package after the top and bottom molds 155-T and 155-B are removed and also the leadframe trimming process is completed to remove the peripheral supporting frames 110 with the molding compound layer 130 protects the package from the top and bottom of the leadframe. The top and bottom via holes 126 in the molding layer 130 are filled with solder material to establish electric contact to the contact pads 125 for electrically communicating with the IC chip 120 through the bonding wires 135 as that further shown in FIG. 5A below.

Figure 4A:
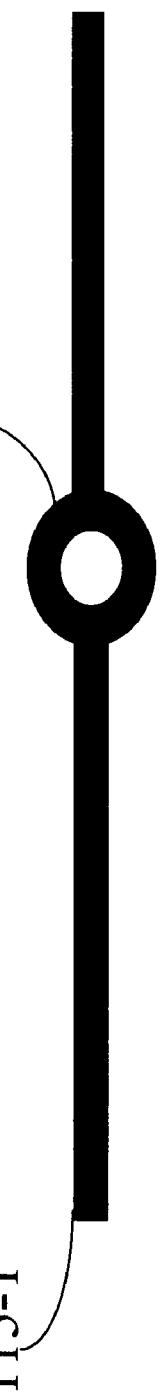
FIG. 4 shows three possible designs of contact placement to match the via-holes in the molding layers.
Figure 4B:
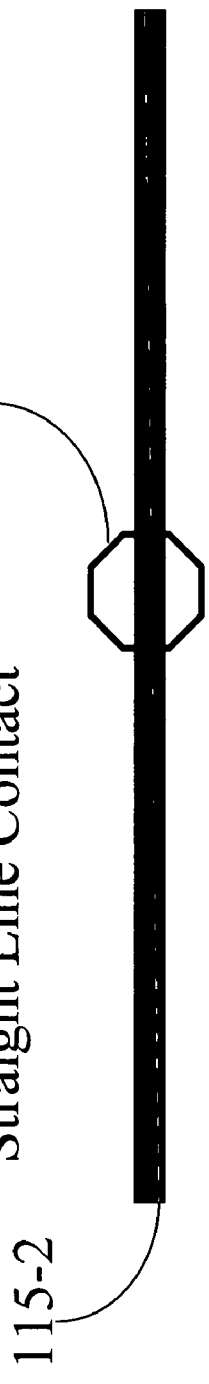
Figure 4C:
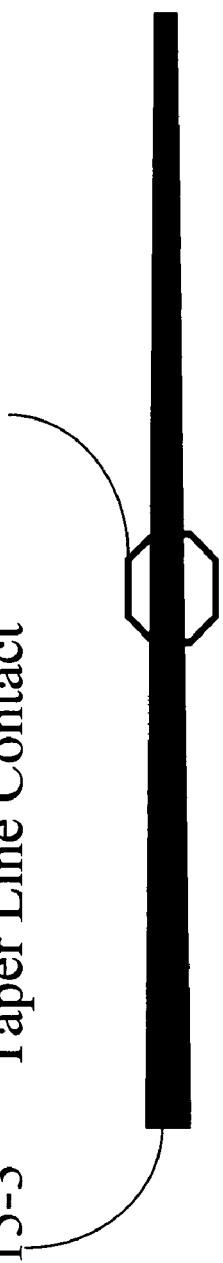

FIGS. 4A to 4C show different possible configurations for each of the metal line 115. FIG. 4A shows a metal line 115-1 that has a donut-shape hole 125 at the contact location. FIG. 4B shows a straight metal line 115-2 that is narrower than the size of the donut-hole shaped contact pad 125 shown in FIG. 4A and smaller than the via hole 126 formed in the molding layer 130. FIG. 4C shows a smaller taper line 115-3 to form a contact with the solder material filling into the via-hole 126.

Referring to FIG. 5A for a cross sectional view, wherein the bonding wires 135 are formed to connect the predefined terminals on the IC chip 120 to corresponding wire-bonding fingers, which are at the inner ends of the metal lines 115 for providing external electrical connections to the IC chip 120. The via-holes 126 are extended through the molding layers 130 as shown in FIG. 5A. The peripheral supporting frame 110 is removed after the package is molded in a molding compound as a protective enclosure 130 for enclosing and protecting the IC chip 120. Referring to FIG. 5B, the solder paste and solder balls 140-T are placed and soldered on the top and 140-B are placed and soldered on the bottom for each of the contact pads 125 that match the via-holes 126 along the metal lines fingers 115. In this package, a top and bottom electrical connections are provided through the top and bottom solder balls 140-T and 140-B as shown in FIG. 5B.

Figure 6:
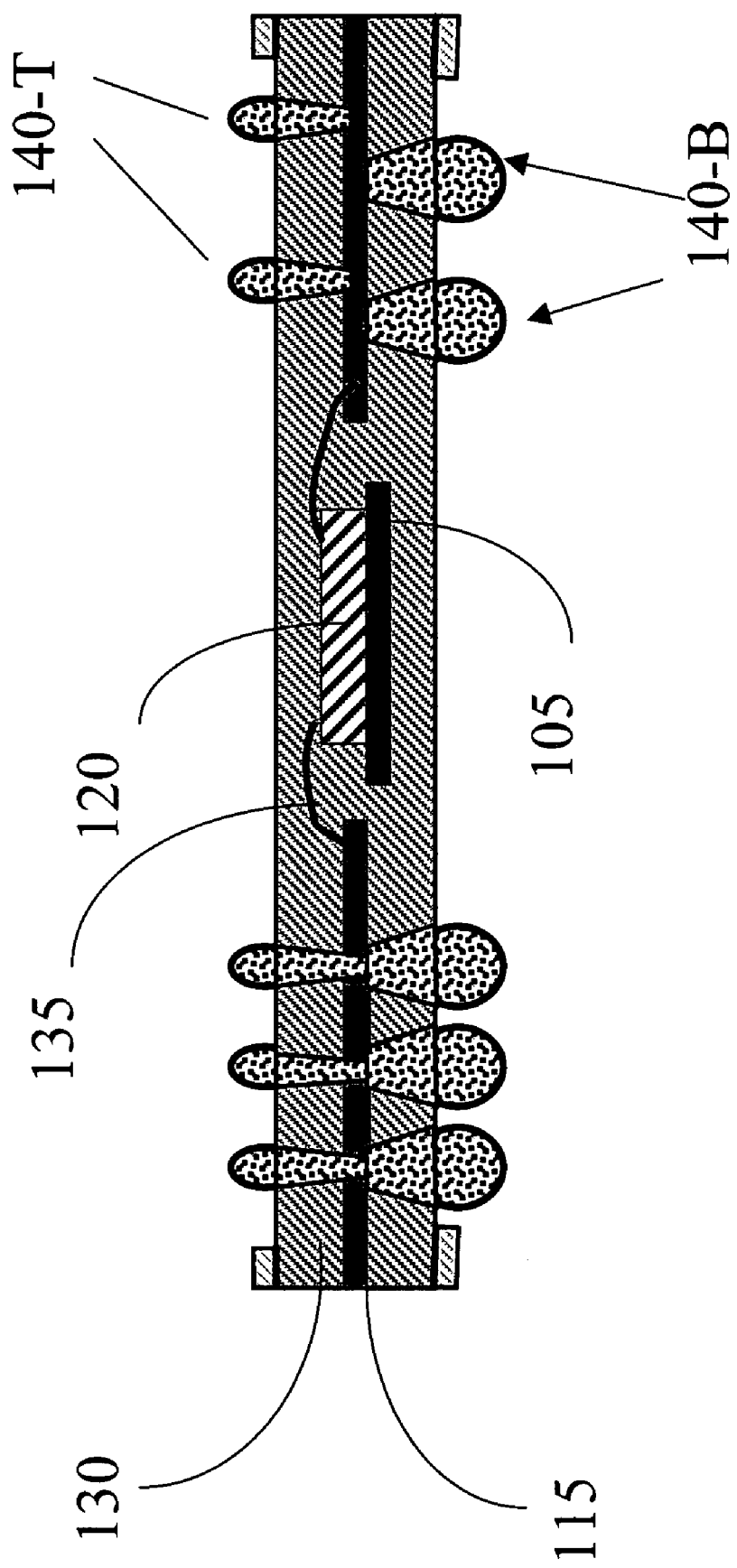
FIG. 6 shows that the via-holes in the molding layer on the topside may or may not align with those on the bottom side. The size of the via-holes could be different depending on the designed requirements.

FIG. 6 is a cross sectional view of another exemplary embodiment of a package with the via-holes opened through the molding layers 130 and the associated solder balls 140-T and 140-B on both top and bottom sides respectively. These solder pastes or solder balls 140-T and 140-B on the top and bottom sides may be aligned as illustrated on the left half, or offset as illustrated in the right half.

Figure 7:
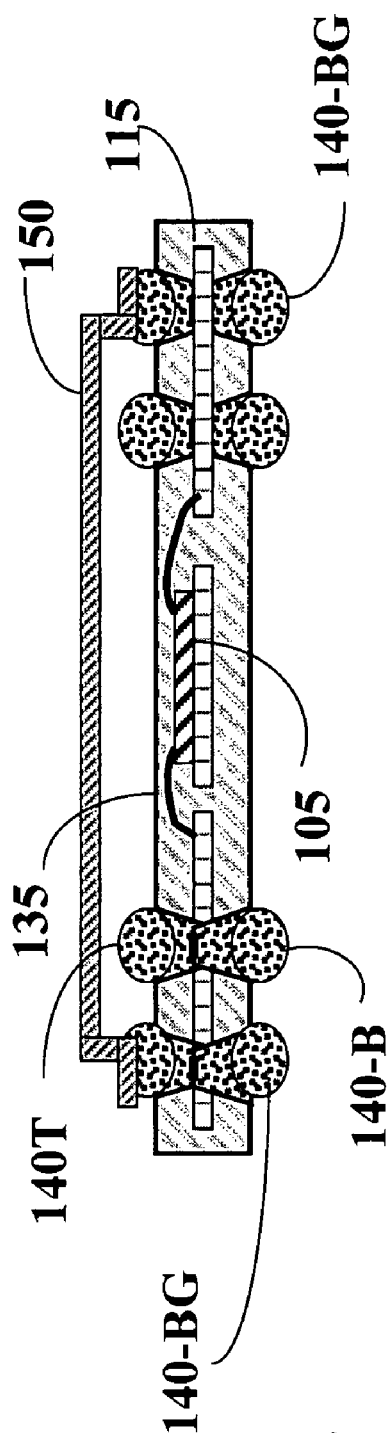
FIG. 7 shows a cross sectional view of a VHBGA package with a ground shield covering the top that is immediately over the IC chip enclosed in a VHBGA of this invention.

Referring to FIGS. 7 and 8 for alternate embodiments of this invention. In FIG. 7, an electrical ground shielding and heat spreader 150 is placed on top of the package to function as an electrical ground shield and also as a heat spreader. The ground shielding structure 150 is connected only to the solder balls 140-BG at electrical ground voltage. A possible embodiment is to place these grounded solder balls on the four corners of the package module. Of course, the package as shown may have more grounded solder balls other than the corner locations. The grounded shield may be pre-pressed so that the corresponding positions to those four corner solder balls may be pushed downward so that the ground shield will be above the other solder balls, which are not to be connected to the ground voltage. Each of these pushed down position may have a concave bottom. This design will facilitate the placement and the self-alignment of the ground shield VHBGA package. The heat dissipation and electrical performance is improved.

In FIG. 8, two packages of this invention 100 and 200 are stacked with the bottom solder balls 140-B of the top package 100 electrically connected to the top solder balls 240-T of the bottom package 200. The stacked packages further include a cooling fins 250 placed on top of the electrical ground shield and heat spreader 150 of the top module 100. Refer to FIGS. 9A and 9B for improvement embodiments for providing stacked packages of the VHBGA packaged modules. In FIG. 9A, the edges of the VHBGA package 100' further includes a standoff height support 160 that can function to reduce the risk of solder balls collapse due to surface tension during high temperature processing. In FIG. 9B, the standoff height supports 160 between the stacked modules 100' and 200' provide additional flexibility for the stacked modules with the surface tension relieved because structure flexibility is provided through these standoff height supports 160 placed between the upper and the bottom modules.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. An electronic package for containing and protecting an integrated circuit (IC) chip further comprising:
    a top and a bottom molding layers including via holes therein filled with a conductive material as top and bottom via-connectors for electrically connecting to said IC chip for providing electrical connections from a top and a bottom sides of said top and bottom molding layers respectively; and
    a standoff height support disposed on a top or bottom molding layers to support another electronic package or packaging structure at a predefined vertical distance for stacking on top or below said electronic package.

2. The electronic package of claim 1 further comprising:
a contact pad disposed around said IC chip coinciding with one of said top or bottom via connectors penetrate through said top or bottom molding layers.

3. The electronic package of claim 1 further comprising:
a donut-hole shaped contact pad disposed around said IC chip coinciding with one of said top or bottom via connectors penetrate through said top or bottom molding layers.

4. The electronic package of claim 1 further comprising:
a bonding-wire finger disposed on a metal line around said IC chip wherein said metal line coinciding with one of said top or bottom via connectors penetrate through said top or bottom molding layers.

5. The electronic package of claim 4 wherein:
said bonding-wire finger is disposed on an inner end of said metal line comprising a local plating layer for bonding wires to electrically connect to said IC chip.

6. The electronic package of claim 1 further comprising:
a tapered metal line comprises a bonding-wire finger disposed around said IC chip wherein said metal line coinciding with one of said top or bottom via connectors penetrate through said top or bottom molding layers.

7. The electronic package of claim 1 further comprising:
a straight-line metal line comprises a bonding-wire finger disposed around said IC chip wherein said metal line coinciding with one of said top or bottom via connectors penetrate through said top or bottom molding layers.

8. The electronic package of claim 1 further comprising:
a metal line comprises a bonding-wire finger disposed around said IC chip wherein said metal line coinciding with one of said top or bottom via connectors penetrate through said top or bottom molding layers and said metal line having a width narrower than one of said via connectors filled in one of said via-holes.

9. The electronic package of claim 1 further comprising:
bonding wires for electrically connecting said IC chip to a bonding-wire finger disposed on a metal line around said IC chip wherein said metal line further comprises a contact pad coincides with and connects to one of said top or bottom via connectors penetrate through said top or bottom molding layers.

10. The electronic package of claim 1 further comprising:
a ball grid array comprises solder balls attached to said top and/or bottom via connectors penetrate through and extended above or below said top or bottom molding layers.

11. The electronic package of claim 1 further comprising:
a bonding-wire finger disposed at one end of a metal line constructed as part of a leadframe wherein said metal line comprises a contact pad connected to a solder ball through a via hole penetrates through the molding layer.

12. The electronic package of claim 1 further comprising:
a bonding-wire finger disposed at one end of a metal line constructed on a top or a bottom surface of a printed circuit board (PCB) disposed around said IC chip wherein said metal line coincides with one of said top or bottom via connectors penetrates through said top or bottom molding layers wherein a metal line on the top surface is connected to a metal line on the bottom surface by an inter-level metal line embedded in the PCB.

13. The electronic package of claim 1 further comprising:
a bonding-wire finger disposed at one end of a metal line constructed as part of a flexible-circuit material wherein said metal line coincides with one of said top or bottom via connectors penetrates through said top or bottom molding layers.

14. The electronic package of claim 1 further comprising:
a ground shield connected to at least one of said top via connectors penetrates through said top molding layers.

15. The electronic package of claim 1 further comprising:
a ground shield connected to at least one of said top via connectors penetrates through said top molding layers wherein said ground shield further include heat spreading fins to function as a heat spreader.

16. The electronic package of claim 1 further comprising:
a heat spreader disposed on top of said electronic package supported on a standoff height support.

17. The electronic package of claim 1 further comprising:
a contact pad disposed around said IC chip coinciding with one of said top or bottom via connectors penetrates through said top or bottom molding layers to function as a pass-through contact for electrically interconnecting vertically stacked IC chips.

18. The electronic package of claim 1 further comprising:
a contact pad disposed around said IC chip coinciding with one of said top or bottom via connectors penetrates through said top or bottom molding layers to function as a pass-through contact for electrically interconnecting vertically stacked IC chips and said pass-through contact is further soldered to a solder ball with an enhanced mechanical strength for said electric package.

19. A molding fixture comprising:
a top-mold and a bottom-mold for enclosing an electronic device in a molding enclosure between said top-mold and bottom-mold;
a molding gate for injecting a molding compound into said molding enclosure; and
said top-mold and bottom mold further include a plurality of top mold-plugs and bottom mold-plugs each has length extended from a surface from said top-mold and bottom-mold to touch the electronic device for forming via holes penetrate through said mold compound from said electronic device above and below said electronic device.

20. The molding fixture of claim 19 wherein:
said top-mold and bottom-mold further enclose said electronic device supported on a lead-frame for carrying out a molding compound injection operation.

21. The molding fixture of claim 20 wherein:
said top mold-plugs and said bottom mold-plugs are substantially mutual aligned above and below a surface of said electronic device.

22. The molding fixture of claim 20 wherein:
at least one said top mold-plugs extended above said electronic device is misaligned with one of said bottom mold-plugs extended below said electronic device.

23. The molding fixture of claim 20 wherein:
said top mold-plugs and said bottom mold-plugs having predefined locations and geometrical configurations to satisfy a set of packaging and via-hole connection requirements for said electronic device.

24. The molding fixture of claim 20 wherein:
said electronic device further comprises an IC chip and a plurality of metal lines with contact pads electrically connected to said IC chip and said top mold-plugs and said bottom mold-plug coincide with said metal lines to contact via hole connectors penetrate through molding layers above and below said electronic device for connecting to said contact pads through said metal lines.

25. A method for protecting and containing an electronic device including an IC chip in an electronic package comprising:
forming a top and a bottom molding layers including via holes penetrate there-through and filled with a conductive material therein as top and bottom via-connectors for electrically connecting to said IC chip for providing electric connections from a top and a bottom sides of said top and bottom molding layers respectively; and
forming a standoff height support on said top or bottom molding layers to support another electronic package or packaging structure at a predefined vertical distance for stacking on top or below said electronic package.

* * * * *